(12) United States Patent
Hosono et al.

(10) Patent No.: US 6,503,852 B2
(45) Date of Patent: Jan. 7, 2003

(54) MANUFACTURING PROCESS FOR SEMICONDUCTOR DEVICE, PHOTOMASK, AND MANUFACTURING APPARATUS FOR SEMICONDUCTOR DEVICE

(75) Inventors: Kunihiro Hosono, Hyogo (JP); Satoshi Aoyama, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/118,138

(22) Filed: Apr. 9, 2002

(65) Prior Publication Data

US 2002/0135073 A1 Sep. 26, 2002

Related U.S. Application Data

(62) Division of application No. 09/783,618, filed on Feb. 15, 2001, now Pat. No. 6,433,437.

(30) Foreign Application Priority Data

Aug. 28, 2000 (JP) ........................................ 2000-257364

(51) Int. Cl.⁷ .............................................. H01L 21/00
(52) U.S. Cl. .......................................... 438/949; 430/5
(58) Field of Search ............................ 438/7, 16, 669, 438/942, 949; 430/5

(56) References Cited

U.S. PATENT DOCUMENTS

| | | | |
|---|---|---|---|
| 6,011,611 A | 1/2000 | Nomura et al. ............... 355/67 |
| 6,014,455 A * | 1/2000 | Sumiyoshi et al. ......... 382/144 |
| 6,048,647 A | 4/2000 | Miyazaki et al. .............. 430/5 |
| 6,150,058 A | 11/2000 | Tu et al. ......................... 430/5 |
| 6,262,428 B1 | 7/2001 | Ito et al. ................ 250/492.22 |
| 6,313,023 B1 * | 11/2001 | Maruyama ................... 438/597 |
| 6,348,357 B2 * | 2/2002 | Sano ............................ 438/16 |

FOREIGN PATENT DOCUMENTS

| | | |
|---|---|---|
| JP | 60-167328 | 8/1985 |
| JP | 8-95229 | 4/1996 |

* cited by examiner

*Primary Examiner*—David Nelms
*Assistant Examiner*—Quoc Hoang
(74) *Attorney, Agent, or Firm*—McDermott, Will & Emery

(57) ABSTRACT

Provided are a manufacturing process for a semiconductor device capable of transferring a pattern corrected with respect of optical distortion of an exposure apparatus, a mask, and a manufacturing apparatus for a semiconductor device.

The manufacturing process, regarding optical distortion of said exposure apparatus as a variation in reduction rate of a transferred pattern in each of regions, includes: a first step transferring a fundamental pattern formed on a reference photomask for measuring the optical distortion to measure a size of a transferred pattern in a corresponding one of regions; and a second step of, based on a result obtained in said first step, forming a corrected photomask having a pattern corrected in said corresponding one of regions with respect to said optical distortion.

13 Claims, 14 Drawing Sheets

DISCHARGE OF DEVELOPER

DEVELOPMENT t₁sec

MAJOR SUBSTEPS

REPETITION

APPLICATION OF RINSE LIQUID

RINSE t₂sec $B_X = B_1 \sin \theta$
$B_Y = B_2 \cos \theta$

MANUFACTURING PROCESS FOR SEMICONDUCTOR DEVICE, PHOTOMASK, AND MANUFACTURING APPARATUS FOR SEMICONDUCTOR DEVICE

This application is a divisional of application Ser. No. 09/783,618 filed Feb. 15, 2001 now U.S. Pat. No. 6,433,437 Priority of application Ser. No. 2000-257364(P) filed on Aug. 28, 2000, in Japan is claimed under 35 USC 119. The certified priority document was filed in Ser. No. 09/783,618 on Feb. 15, 2001.

BACKGROUND OF THE INVENTION

1. Field of the Invention

The present invention relates to a manufacturing process for a semiconductor device by means of which improvements are achieved on accuracy and uniformity of a size of a transferred pattern in a pattern transfer step of the manufacturing process for a semiconductor device by suppressing optical distortion of an exposure apparatus, a photomask and a manufacturing apparatus for a semiconductor device.

2. Description of the Background Art

In an exposure apparatus used in manufacturing a semiconductor device, light radiated from a light source is transmitted through patterns on a photomask to be projected on a wafer surface to make an image. In FIGS. 28 and 29, shown are prior art photomasks formed by means of a prior art method. In FIG. 28, arranged are rectangular patterns 113 a of the same shape having a side a in length in a uniform distribution on a photomask 103. Furthermore, in FIG. 29, formed is a single pattern 113 having a constant width L along a bending shape in photomask 103. A photoactive positive or negative photo resist is applied on a semiconductor wafer in advance. When a positive photoresist is employed, a part of the photoresist on which light through a photomask is irradiated is removed in a following developing step, while a non-irradiated part of the photoresist on which the light doesn't irradiate remains in the following developing step. With such a process adopted, a pattern on the photomask is transferred on the wafer as a pattern of photo resist. By using the pattern of the photoresist, etching and impurity implantation are performed to manufacture a semiconductor device.

A photomask is manufactured such that as shown in FIG. 28, patterns of the same size are arranged in a repeated arrangement (periodical arrangement) and the same patterns are distributed in a uniform manner with respect to a size in each of regions all over the surface of the mask regardless of locality of a region to increase uniformity in terms of size of devices. Moreover, there is also included a step in which a non-repeated pattern (non-periodical pattern) as shown in FIG. 29 is transferred. The pattern with no repetition is also transferred by means of a transfer apparatus such that no variation in size occurs. Hence, each optical systems such as lenses of exposure apparatuses are designed and manufactured such that a pattern is transferred with uniformity.

Distortion in an optical system of an exposure apparatus is, however, difficult to be perfectly eliminated and in addition, characteristics of the distortion are different in each exposure apparatus. For this reason, a pattern on a photomask is not necessarily transferred in a faithful manner. As a result, a transferred resist pattern is affected by optical distortion specific to each exposure apparatus, resulting in a variation in performance of a semiconductor device In order to solve such a problem, a proposal has been made on a photomask to correct optical distortion in an exposure apparatus (see Japanese Patent Laying-Open No. 60-167328 and Japanese Patent Laying-Open No. 8-95229). By use of such a photomask corrected with respect to optical distortion, a variation in performance of a semiconductor device is alleviated. Correction methods for optical distortion disclosed in the above described publications are, however, to correct positional displacements of points on a photomask, wherein objects for the correction are a direction of a displacement and a distance thereof. Therefore, there has remained a problem in that the correction of optical distortion is complex and that no recognizable improvement can be achieved without the correction with very high accuracy. Since in a manufacturing process of a semiconductor device, a tremendous number of photomasks are employed, even only photomasks used in manufacturing steps which affect characteristics of the semiconductor device are difficult to be corrected in advance when depending on too complex a correction method. Hence, in ompany with progress in microfabriation of a semiconductor device, there has been built up a demand for a manufacturing process for a semiconductor device capable of obtaining an exposure-transferred pattern with high accuracy in a simple and convenient manner.

SUMMARY OF THE INVENTION

It is an object of the present invention to provide a manufacturing process for a semiconductor device capable of correcting optical distortion of an exposure apparatus in simple and convenient manner, a mask for use in the manufacturing process, and a manufacturing apparatus provided with the mask for a semiconductor device.

A manufacturing process for a semiconductor device of the present invention is a manufacturing process for a semiconductor device including a step of transferring a pattern on a photomask onto a semiconductor wafer by means of an exposure apparatus. The manufacturing process regards optical distortion of an exposure apparatus as a variation in reduction rate of a transferred pattern in each of regions of a photomask and includes: a first step of transferring a fundamental pattern formed on a reference photomask for measuring the optical distortion to measure a size of the transferred pattern in a corresponding one of regions; and a second step of, based on a result obtained in the first step, forming a corrected photomask having a pattern corrected in the corresponding one of regions with respect to the optical distortion.

According to such a constitution, an optical distortion can be obtained as a size of a pattern in each region on a photomask, or a rate of a size of a transferred pattern in a corresponding region and a size of a pattern on the photomask. The size and size rate can be obtained with ease, and furthermore, a corrected photomask can be fabricated based on the size or size rate in a simple and convenient manner. For this reason, a tremendous number of photomasks for use in manufacturing steps to affect characteristics of a semiconductor device can be replaced with respective corrected photomasks in a simple and convenient manner. Consequently, not only can a variation in a transferred pattern in each of exposure appratuses can be restricted, but a dimensional variation in each of portions in a semiconductor device caused by optical distortion, which differs between exposure apparatuses, can be suppressed, such that sizes of portions in a semiconductor device formed through a different exposure apparatus can be all uniform. As a result, miniaturized semiconductor devices with high reliability can be provided with a high manufacturing yield.

Note that optical distortion appears as a variation in a magnification rate or reduction rate in each region; therefore, the above described fundamental patterns are desirably provided across all regions of a reference photomask.

In the manufacturing process for a semiconductor device of the present invention, a fundamental pattern on the reference photomask is, for example, a plurality of unit patterns of the same shape arranged on the reference photomask.

By providing a reference photomask having unit patterns arranged thereon as described above, the area of a photomask is divided into regions including each unit pattern and a magnification rate or reduction rate can be obtained in each region. In a corrected photomask, a pattern size is corrected in each region based on a magnification rate or reduction rate for the region. This correction is performed such that a product of a magnification rate or reduction rate in each region and a pattern size in a corresponding region of a corrected photomask is the same as each other in any of all the regions regardless of particularity of a region. By use of the corrected photomask, when patterns of the same shape are intended to be disposed, for example, in a repeated arrangement (periodical arrangement) in a transferred pattern, the same patterns can be obtained in the respective regions as intended, in the transferred pattern.

In the manufacturing process of a semiconductor device of the present invention, a fundamental pattern on the reference photomask may be, for example, a non-periodical pattern with no periodicity formed on the reference photomask.

In manufacture of a semiconductor device, there are many cases where a single pattern with no periodicity is transferred and such a non-periodical pattern is necessary to be corrected with respect to a variation in size due to optical distortion. In a case of the non-periodical pattern as well, correction of a variation in size is effected by correcting a variation in reduction rate of each region similar to the case of a periodical pattern. As a result, a size accuracy in a pattern is improved and a variation in size between semiconductor devices processed by respective different exposure apparatuses can be restricted.

In the manufacturing process for a semiconductor device of the present invention, the first step desirably includes: for example, a step of obtaining a reduction rate which is a rate between a size of the transferred fundamental pattern and a size of the fundamental pattern on the reference photomask in each of regions of the reference photomask.

By obtaining a reduction rate in each of the regions, a corrected photomask can be manufactured with simplicity and convenience. When it is intended that the same patterns are provided in respective regions in a transferred pattern, patterns on a corrected photomask have only to be formed such that a size of each of the respected patterns on the corrected photomask is in inverse proportion to a reduction rate of a corresponding region.

In the manufacturing process for a semiconductor device of the present invention, it is desirable that in the second step, for example, a size of a pattern in each of the regions of the corrected photomask is desirably formed such that a corrected reduction rate which is a rate between a size of a corrected, transferred pattern that is a transferred pattern of a pattern of the corrected photomask and a size of a pattern on the photomask prior to the correction in each of the regions is the same throughout all the regions regardless of each locality.

According to the above described constitution, optical distortion of an exposure apparatus is eliminated and a transferred pattern as intended can be obtained. For this reason, even when a transfer step is performed in a different exposure apparatus, photoresist patterns of the same size or the like are formed on a semiconductor substrate; and etching, impurity implantation and others can be performed based on the photoresist patterns of the same size. As a result, semiconductor devices with a high manufacturing yield, high reliability and high performance can be provided with simplicity and convenience.

In the manufacturing process for a semiconductor device, in the second step, for example, a size of a pattern in each of the regions of the corrected photomask is desirably formed such that a product of a pattern correction rate which is a rate between a size of a pattern in a region on the corrected photomask and a size of a pattern in a corresponding region of the photomask prior to the correction and a reduction rate in the region is the same regardless of which of all the regions the region belongs to.

The photomask prior to the correction is a photomask in a case where it is assumed that no optical distortion is present in an exposure apparatus and may be either existent or imaginary. By forming a pattern on a corrected photomask as described above, when the corrected photomask is used in the exposure apparatus, the optical distortion can be eliminated in terms of size. As a result, patterns which have been transferred in different ways in respective different exposure apparatuses can be transferred in a similar way as each other regardless of an exposure apparatus; therefore, high reliability semiconductor devices can be manufactured with a high manufacturing yield. Note that the above described pattern may be either a pattern set constituted of the same pattern repeatedly arranged in each of regions in a similar way or a pattern with no periodicity (non-periodical pattern) arranged across regions.

In the manufacturing process for a semiconductor device of the present invention, it is desirable that in the second step, for example, a pattern of a prescribed portion of the semiconductor device are arranged in each of the regions of the corrected photomask in a similar way, and a size of a pattern in each of the regions of the prescribed portion of the semiconductor device is determined such that a product of a size of a pattern of the prescribed portion of the semiconductor device in a region on the corrected photomask and a reduction rate in the region is the same all over the regions regardless of which of all the regions the region belongs to.

In a case where a pattern set is constituted of patterns of the same shape arranged in respective regions, a photomask prior to correction is not necessary to be referred to but a corrected photomask can be manufactured according to the above described constitution. By using the corrected photomask in the exposure apparatus, optical distortion can be eliminated in terms of size, thereby enabling manufacturing a high reliability semiconductor device with a high yield.

In the manufacturing method for a semiconductor device of the present invention, it is allowed that the second step includes a photomask manufacturing process and a pattern of the corrected photomask may be corrected in terms of size by adjusting at least one of a writing beam diameter and a writing dose with respect to a position of the corrected photomask in a resist writing step of the photomask manufacturing process.

In a case where a positive resist is used, a resist-lacking section occurs covering a large area if a writing beam diameter and a writing dose is large. That is, since an area of a resist-lacking section is in proportion to a writing beam diameter or a writing dose, a size of a pattern in each region can be adjusted by controlling such factors. The adjustment of a size in this case is not so large as to produce a change in shape of a pattern, but only at a subtle level of the order to be perceptible by an expertise, which is achieved by controlling at least one of a writing beam diameter or a writing dose as described above. Hence, by controlling the factors in a proper manner, an appropriate correction can be effected in a simple and convenient manner with good efficiency.

In the manufacturing process for a semiconductor device of the present invention, it is allowed that the second step includes a photomask manufacturing process and a pattern on the corrected photomask is corrected in terms of a size by adjusting a way of supply of a developer in a resist developing step of the photomask manufacturing process.

The adjustment can also be performed in a resist developing step. A developing reaction is accelerated at a writing site supplied with a fresh, unused developer and thereby, resist removal progresses ahead of the other sites to a larger extent there. For this reason, by adjusting a position and a direction of a nozzle; a residence time at each site of a nozzle, if movable; in addition, a discharge amount of a developer; and others, formation of a corrected pattern with a desired pattern size distribution is effected. Since the optical distortion, in many cases, differs at a degree thereof in each of regions partitioned concentrically, formation of a pattern in each of the regions may be sufficiently controlled, in many cases, if the photomask is separated into central and peripheral regions and an intermediate region therebetween. Note that correction of an area of a resist-lacking section can also be effected on an area of a writing site of the same magnitude.

In the manufacturing process of a semiconductor device of the present invention, it is also allowed that the second step includes a photomask manufacturing process and a pattern on the corrected photomask is corrected in terms of size by adjusting a way of supply of an etching liquid in a wet etching step for a Cr film in the photomask manufacturing process.

The way of supply of a developer applies to a way of supply of the etching liquid in the wet etching of a Cr film without any change therein. Hence, a size of a Cr film-lacking section can be corrected even when an area of a resist-lacking section is the same.

In the manufacturing process of a semiconductor device of the present invention, it is also allowed that the second step includes a photomask manufacturing process and a pattern of the corrected photomask is corrected in terms of size by adjusting a strength of a magnetic field in a dry etching step for a Cr film of the photomask manufacturing process.

By adjusting a strength of a magnetic field, a flow of a plasma gas, which is constituted of an etching gas, can be controlled. As a result, a desired, corrected photomask can be obtained by adjusting an etching rate in each of central and peripheral regions and an intermediate region therebetween.

In the manufacturing process for a semiconductor device of the present invention, it is desirable that the magnetic field in a dry etching step for the Cr film is a rotating magnetic field formed such that a combination of two orthogonal magnetic fields are applied in synchronism with each other in parallel to a surface of the corrected photomask and adjustment of a strength of the magnetic field is effected by controlling the two magnetic fields independently of each other.

By adjusting the two magnetic fields independently of each other, the center of the rotating magnetic field can be migrated along a surface of the photomask. Hence, when optical distortion occurs in one side portion of the photomask or in the like case, the above described constitution is preferable in correcting such a kind of optical distortion. Moreover, this can applies to cancellation of optical distortion whose degree changes along a concentric circle.

In the manufacturing process of a semiconductor device of the present invention, it is also allowed that the second step includes a photomask manufacturing process and a pattern on the corrected photomask is corrected in terms of size by combining factors for a change in size of a pattern in at least two steps among a resist writing step, a resist developing step and a Cr film etching step of the photomask manufacturing process.

As described above, a size of a pattern in each of regions can increase or decease with a larger adjustment width by combining at least two steps. Hence, as high degree an optical distortion as not to be adjustable in a single step of an exposure apparatus can be adjusted with simplicity and convenience.

A photomask of the present invention is a photomask having a pattern thereon, employed in transfer of the pattern onto a semiconductor wafer by means of an exposure apparatus. Correction of a size of a pattern on the photomask is performed such that correction is effected on a variation in reduction rate of a transferred pattern in each of regions caused by optical distortion of the exposure apparatus.

This photomask is a corrected one described above and the photomask can be fabricated with simplicity and convenience. Since optical distortion on a pattern on the photomask is corrected in terms of size, a transferred pattern with an as-intended size can be obtained in each of regions thereof.

In the photomask of the present invention, a reduction rate can be regarded to be one as measured in each of the regions of a transferred pattern from a fundamental pattern formed on a reference photomask exclusively used in measurement of optical distortion of an exposure apparatus.

Since optical distortion is measured as a size of each of regions, the optical distortion can be evaluated with much of simplicity and convenience and a method for reflecting the measured optical distortion on fabrication of a corrected photomask is also very simple and convenient. Therefore, a tremendous number of photomasks required in a manufacturing process for a semiconductor device can be replaced only with a necessary number of corrected ones in a simple and convenient manner. As a result, for example, a semiconductor device having a memory capacity larger than a currently available one by one rank can be manufactured using currently existing facilities with none of an additional large investment thereon.

A manufacturing apparatus for a semiconductor device provided with a photomask of the present invention is a manufacturing apparatus for a semiconductor apparatus to transfer a pattern arranged on a photomask onto a semiconductor wafer to perform exposure. In the manufacturing apparatus for a semiconductor device, the photomask is disposed between a light source for exposure and the semiconductor wafer.

By employing the above described manufacturing apparatus for a semiconductor device, a high reliability semiconductor device can be provided with a high yield.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Below, description will be given of embodiments of the present invention using the accompanying drawings.

[First Embodiment]

Figure 1:
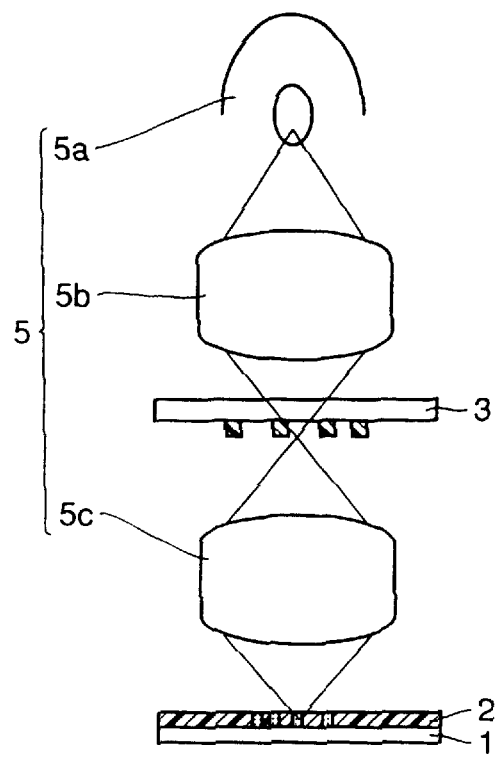
FIG. 1 is a diagram representing an exposure step in a manufacturing process for a semiconductor device of a first embodiment of the present invention.

In a manufacturing process for a semiconductor device of the first embodiment of the present invention, description will be given including a correcting process for optical distortion of an exposure apparatus. Referring to FIG. 1, in an exposure apparatus 5, light rays radiated from a light source 5a are transmitted through a photomask 3 on which a pattern is formed and projected onto a surface of a semiconductor wafer to make an image. A photoactive photoresist 2 is applied on the wafer 1 in advance of exposure. When a positive photoresist is employed, part of the photoresist 2 irradiated with light transmitted through a light transparent region of a pattern 3 is removed in a developing step coming later, while part of the photoresist 2 not irradiated with the light is remained. Thereby, a pattern on the photomask is transferred on the wafer as a resist pattern. The above described step is an exposure/transfer step in a manufacturing process for a semiconductor device. Note that a light source for exposure may be of any type with which writing can be effected on the resist: for example laser light or an electron beam.

Figure 2:
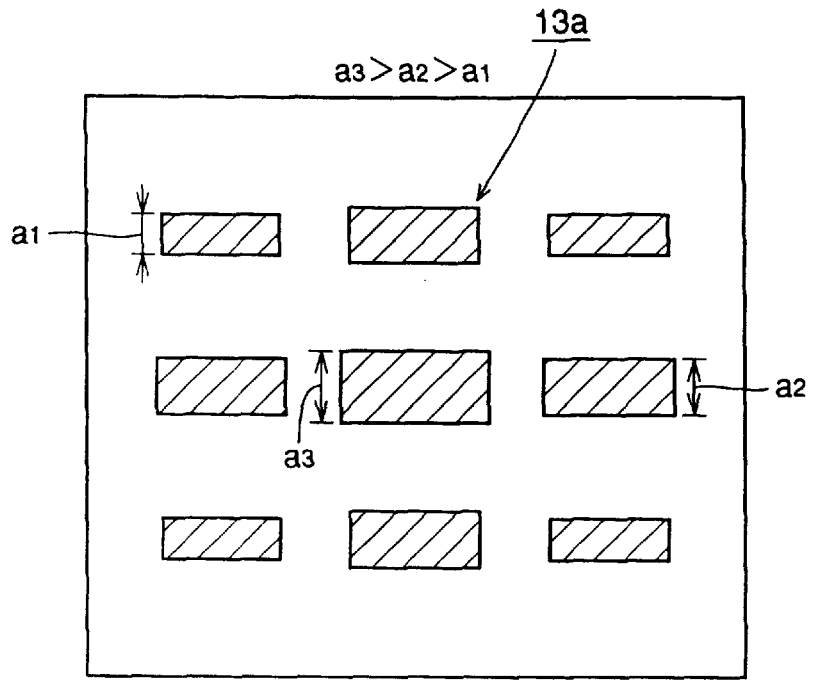
FIG. 2 is a plan view representing an example pattern on a photomask in a manufacturing process for a semiconductor device of the first embodiment.
Figure 3:
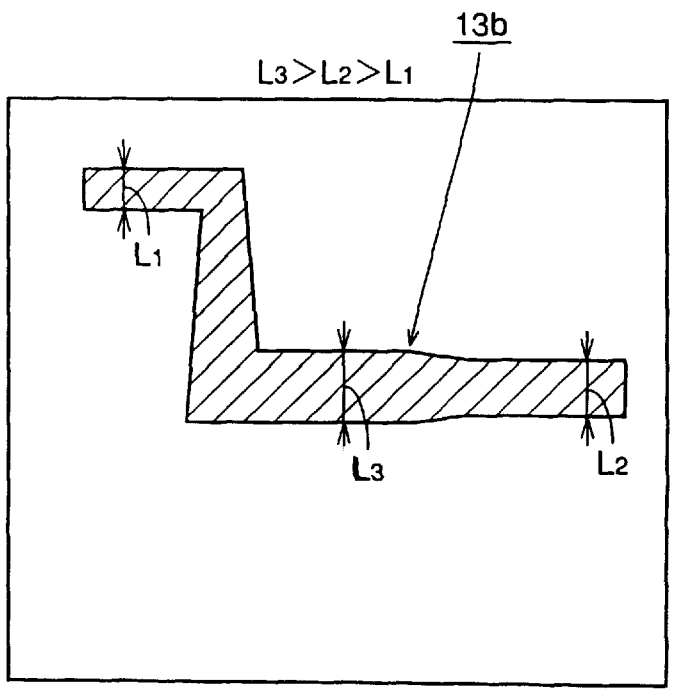
FIG. 3 is a plan view representing another example pattern on a photomask in a manufacturing process of a semiconductor device of the first embodiment.

FIG. 2 is a plan view representing an example corrected photomask 3 in the first embodiment of the present invention. The mask is a mask obtained by correcting a pattern 113a of no correction on the photomask 103 shown in FIG. 28. Moreover, FIG. 3 is a plan view representing another example corrected photomask 3 in the first embodiment of the present invention. The example of FIG. 3 is a mask obtained by correcting a pattern 113b of no correction on the photomask 103 shown in FIG. 29. In the present invention, objects include not only a pattern set 13a composed of similar patterns in a repeated arrangement as shown in FIG. 2, but also a pattern 13b with no repetition of pattern as shown in FIG. 3

Next, description will be given of a manufacturing process for the patterns on corrected photomasks shown in respective FIGS. 2 and 3.

Figure 4:
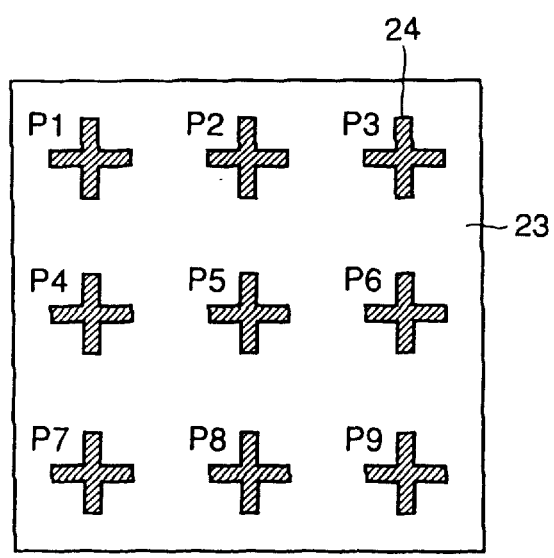
FIG. 4 is a plan view representing an example unit pattern as a kind of fundamental pattern on a reference photomask for measurement of optical distortion of an exposure apparatus.
Figure 5:
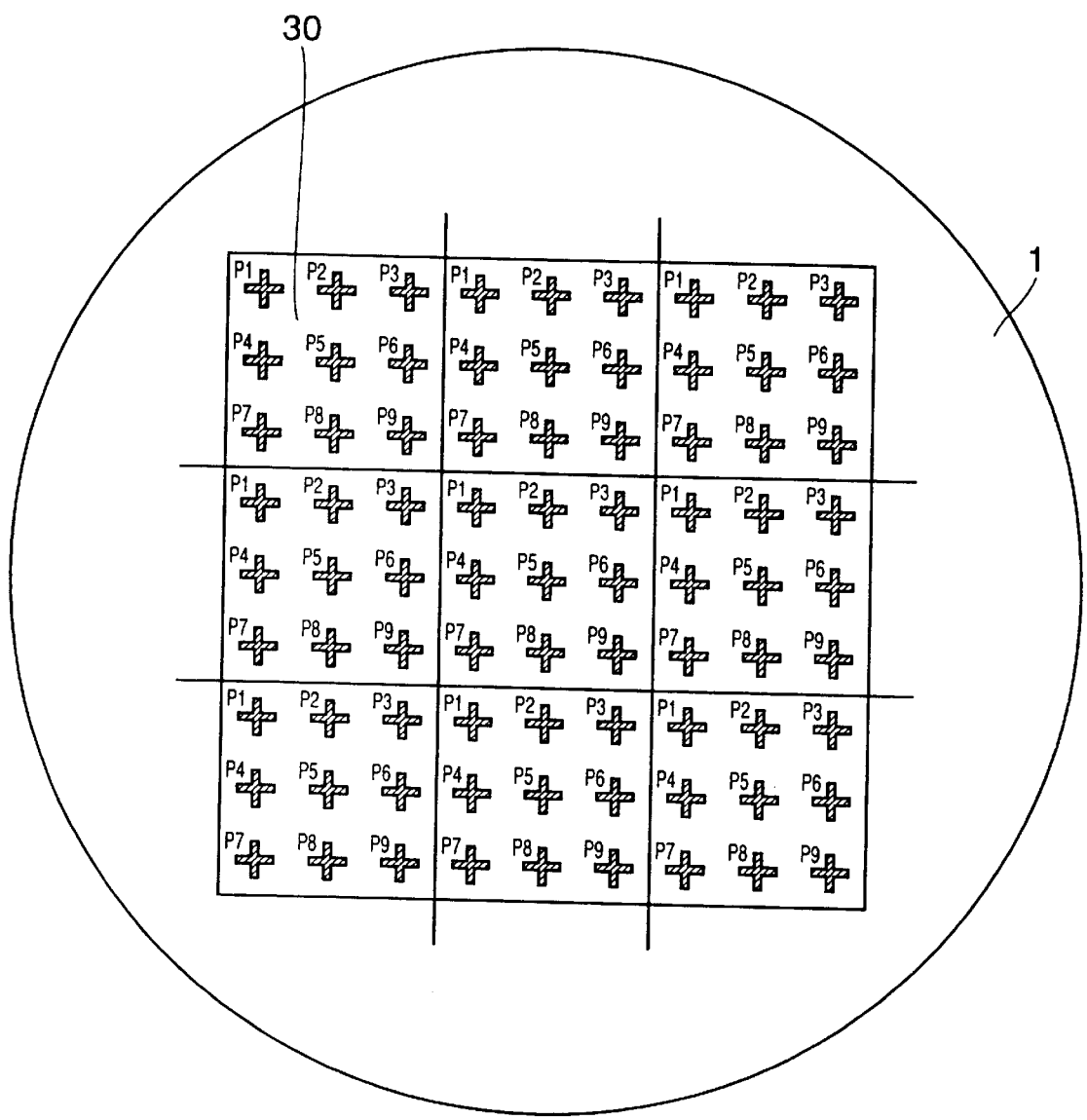
FIG. 5 is a plan view representing a state where the unit patterns on the reference photomask shown in FIG. 4 are transferred onto a semiconductor wafer by a stepper.

First of all, in order to measure optical distortion of an exposure apparatus in terms of size, for example, a reference photomask 23 as shown in FIG. 4 is prepared on which 9 cross patterns 24, which are unit patterns (fundamental pattern) for use in size evaluation for an element, are arranged. Positions of the unit patterns each correspond to a point in the vicinity of the center of each of regions of the reference photomask 23. The 9 unit patterns 24 are all formed so as to be of the same size as each other. Then, as shown in FIG. 5, the unit patterns are projected onto a surface of a wafer and such a projection is repeated by a stepper to transfer images of the unit pattern set onto all the surface of the wafer. An issue to be processed with respect to optical distortion of the exposure apparatus is a variation in size of the unit patterns P1 to P9 in a one exposure step. That the issue points out a variation in size of the unit patterns P1 to P9 in a one step field of a transfer pattern set 30 in FIG. 5. By measuring an element size on the photomask and an element size on the semiconductor wafer, the optical distortion of the exposure apparatus can be determined. Results of the measurement are shown in Table 1.

TABLE 1

| Regions | P1 | P2 | P3 | P4 | P5 | P6 | P7 | P8 | P9 |
|---|---|---|---|---|---|---|---|---|---|
| Pattern size on mask (M) | 1.52 | 1.53 | 1.56 | 1.52 | 1.53 | 1.54 | 1.57 | 1.56 | 1.53 |
| Transferred pattern size (U) | 0.32 | 0.31 | 0.33 | 0.31 | 0.30 | 0.31 | 0.33 | 0.32 | 0.33 |
| Reduction rate (U/M) | 0.211 | 0.203 | 0.212 | 0.204 | 0.196 | 0.201 | 0.210 | 0.205 | 0.216 | unit ($\mu$m)

When an exposure apparatus has no optical distortion, a pattern on the photomask is to be transferred onto a surface of the wafer at a 1/5×reduction rate. Due to optical distortion of the exposure apparatus, however, a reduction rate is not the same all over the surface of the photomask; reduction rates are different between in the central region and in the peripheral region. According to the results of Table 1, it is seen that the patterns in the peripheral region are transferred onto the wafer with a size larger than that in the central region. That is, the exposure apparatus has a characteristic that patterns in the peripheral region of a mask are transferred onto a wafer with a size larger or at a reduction rate larger than that in the central region.

Figure 6:
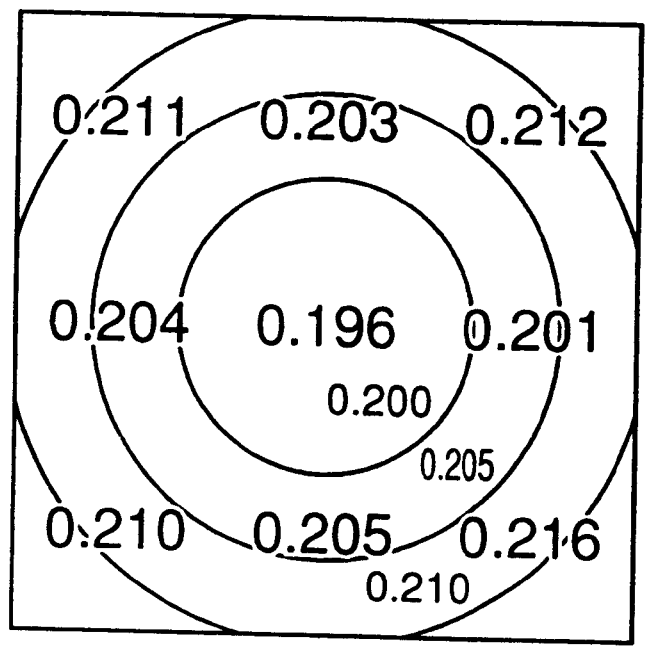
FIG. 6 is a diagram representing a distribution of a reduction rate shown in Table 1.

In FIG. 6, shown is a result of plotting of the reduction rate of Table 1 in regions. While optical distortion occurs at the same level along a concentric circle with an optical axis of the mask as a center, changing radially; in FIG. 6 as well, the same values of a reduction rate are located along a concentric circle and optical distortion changes radially while keeping values equal to each other along a concentric circle.

Corrected photomasks shown in FIGS. 2 and 3 can be obtained in the following way: Note that for convenience of description, regions in which the unit patterns P1 to P9, respectively, are located are indicated by symbols P1 to P9 of the respective unit patterns P1 to P9.

Figure 28:
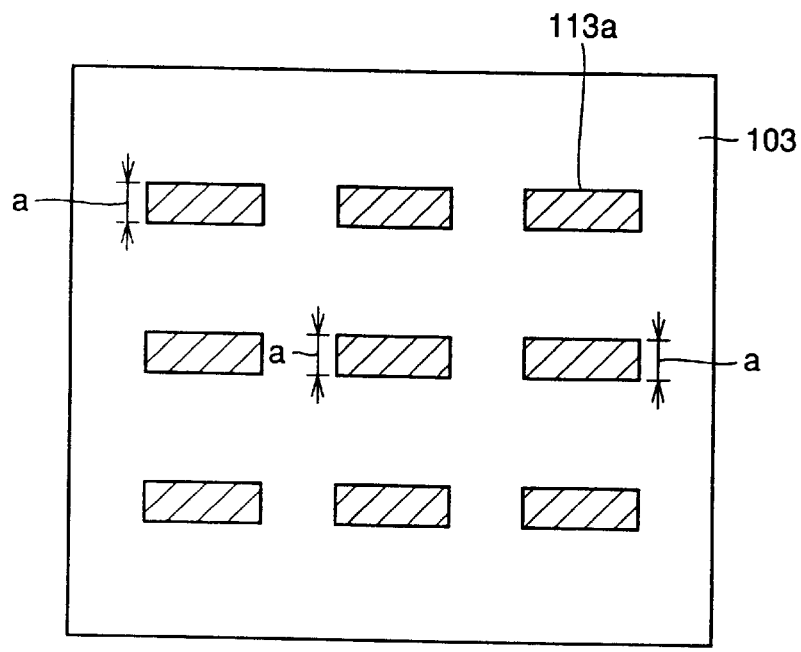
FIG. 28 is a plan view representing an example photomask having a prior art uncorrected pattern.

Describing of the corrected photomask of FIG. 2, the patterns a of the same size of FIG. 28 are rewritten in proportion to a reciprocal of a reduction rate shown in FIG. 6. That is, a smaller pattern size ai is adopted in the peripheral regions P1, P3, P7 and P9 in which a pattern is harder to be shrunk in transfer when compared with the other regions, while contrary to this, a larger pattern size as is adopted in the central region P5 in which a pattern is shrunk at a degree larger than in the other regions. A pattern size a2 is adopted in the intermediate regions P2, P4, P6 and P8. With such a procedure, pattern correction rates $a_3/a$ (for the central region), $a_1/a$ (for the peripheral region) and $a_2/a$ (for the intermediate region) can be obtained in the respective regions of FIG. 2.

Figure 29:
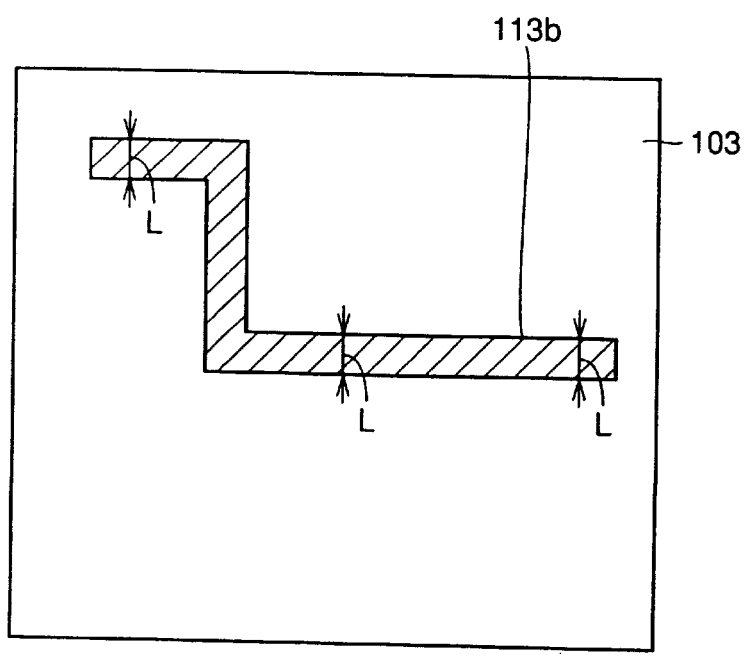
FIG. 29 is a plan view representing another example photomask having a prior art uncorrected pattern.

A corrected photomask shown in FIG. 3 is that obtained by rewriting the pattern shown in FIG. 29 such that a size L in each region of FIG. 29 is changed in proportion to a reciprocal of a corresponding reduction rate. That is, a size $L_1$ of the peripheral region is set smaller than that of the other regions, a size $L_3$ of the peripheral region is set larger than that of the other regions and a size $L_2$ of the intermediate region is set as an intermediate value therebetween.

By use of the corrected photomasks of FIGS. 2 and 3 obtained by correcting with respect to optical distortion in transferring patterns onto a wafer, corrected transferred patterns are obtained and in turn, patterns with as-intended sizes specific to respective regions can be transferred. As a result, a corrected reduction rate, that is a rate in size between a corrected transferred pattern and a pattern on a photomask prior to the correction, assumes the same values, regardless of a region, throughout all the regions.

In the above description, description is given of the case where a pattern is transferred larger as the pattern is located closer to the peripheral region. However, there is no specific limitation to this tendency with respect to optical distortion of an exposure apparatus, but a pattern is transferred larger either in the central region or in a specific side of the peripheral region; an optical distortion characteristic alters in various ways according to an exposure apparatus. The present invention makes it possible that a pattern image of a uniform size can be, in any case, transferred onto a wafer by use of a photomask corrected according to the characteristic of optical distortion of a particular exposure apparatus.

In the mean time, a measuring method for optical distortion is described above with patterns on a photomask arranged such that one cross pattern is located in each region which is one of 9 regions obtained by dividing a photomask into 9 pieces for convenience of description. It is naturally needless to say that there is no specific limitation to this way to divide the photomask into the 9 regions. By dividing the photomask into more regions each with a smaller area, accuracy of correction can be enhanced.

When optical distortion of an exposure apparatus, that is a distribution of a reduction rate of a cross pattern, is measured and a pattern is formed on a photomask such that a size thereof is inverse proportion to a reduction rate, then a transferred pattern set each with a uniform size as intended can be obtained. As a result, microfabrication of a semiconductor device can be realized in a simple and convenient manner without installing facilities of a immensely great cost.

[Second Embodiment]

In the second embodiment of the present invention, description will be given of a manufacturing process for a photomask corrected with respect to optical distortion, for use in the above described manufacturing process for a semiconductor device.

Figure 7:
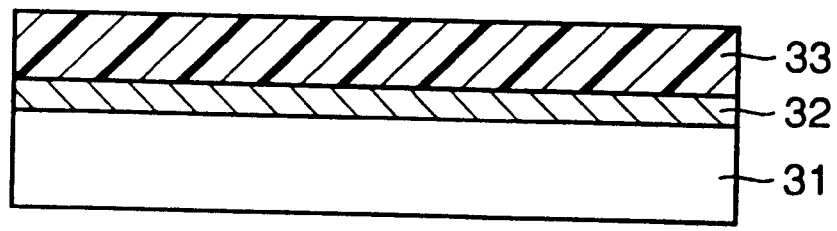
FIG. 7 is a sectional view representing a state of a photomask having a synthetic quartz substrate on which a Cr film is vapor deposited and then coated with a photoresist in a manufacturing process flow for a photomask in a second embodiment of the present invention.
Figure 8:
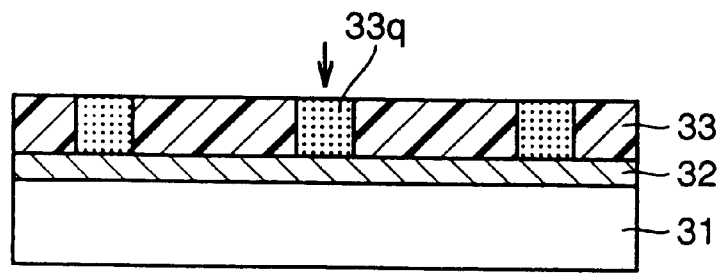
FIG. 8 is a sectional view representing a state of a photomask, over a resist on which EB irradiation has been performed following the stage of FIG. 1, and in the resist on which a writing section is formed.
Figure 9:
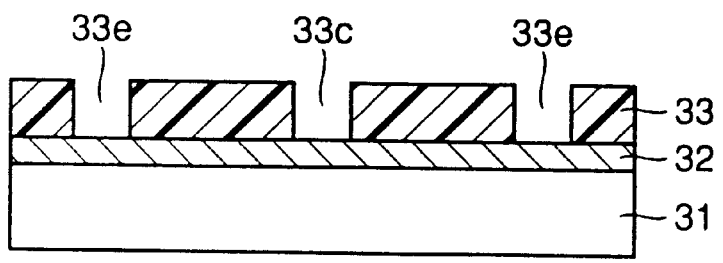
FIG. 9 is a sectional view representing a state of the photomask, from the resist on which the writing section has been removed following the stage of FIG. 8.
Figure 10:
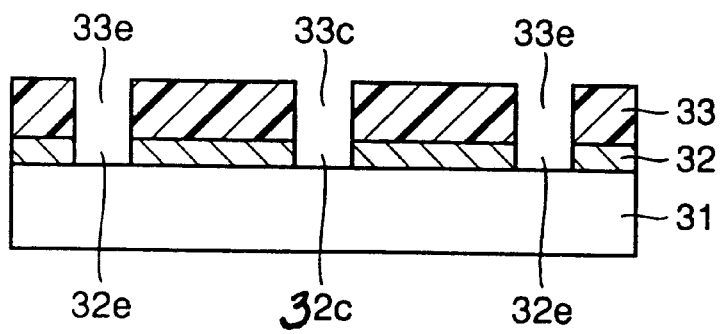
FIG. 10 is a sectional view representing a state of the photomask, a Cr film on which has been etched off with the resist as a mask following the stage of FIG. 9.
Figure 11:
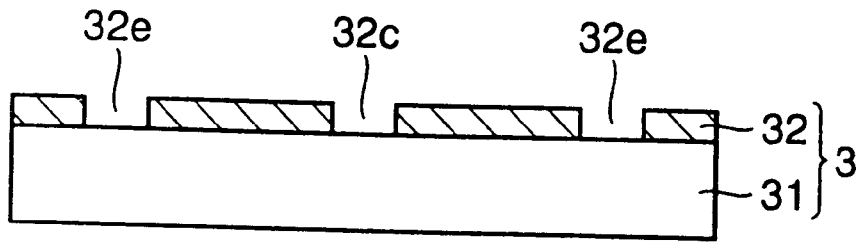
FIG. 11 is a sectional view representing a state of the photomask, the resist on which is removed following the stage of FIG. 10.

First of all, description is directed to a manufacturing process for a photomask used in a manufacturing process for a semiconductor device. As shown in FIG. 7, in a first stage, a Cr film 32 is vapor deposited onto a synthetic quartz substrate 31 as a base of a photomask and then, an EB resist 33, for example a positive resist ZEP-7000 (a registered trade mark) made by Nihon Zeon K. K., is spin-coated thereon to a desired thickness of about 400 nm. Thereafter, the photoresist coat is baked at 190° C. for one min. Following the baking step, writing is performed by an EB (Electron Beam) writing apparatus (not shown) to form a writing section 33q, which is a portion irradiated with EB. Thereafter, when a pattern image in the photoresist 33 is developed by a developer, the writing section 33q is selectively removed to form resist-lacking sections 33c and 33e as shown in FIG. 9. The Cr film 32 is partially etched off based on the resist pattern to complete a photomask. When wet etching is adopted in the etching step, the etching liquid is sprayed. On the other hand, when dry etching is adopted in the etching step, the Cr film is partially etched off using a magnetic-enhanced dry etching apparatus as an example. By the etching step, Cr film-lacking sections 32c and 32e are formed as shown in FIG. 10. Thereafter, the resist is removed as shown in FIG. 11 to complete a photomask 3 composed of the synthetic quartz substrate 31 and the Cr film 32 with the film-lacking sections.

A photomask having a pattern size distribution to correct optical distortion of an exposure apparatus as shown in the first embodiment is fabricated by means of the following process in the second embodiment.

When writing on a mask is performed by means of an EB writing apparatus, a size of a writing site alters according to a dose, which is an irradiation amount of an electron beam. When a positive resist is employed, a size of the writing section 33q increases in proportion to a dose and over-processing occurs with an excessive dose irradiated.

Figure 12:
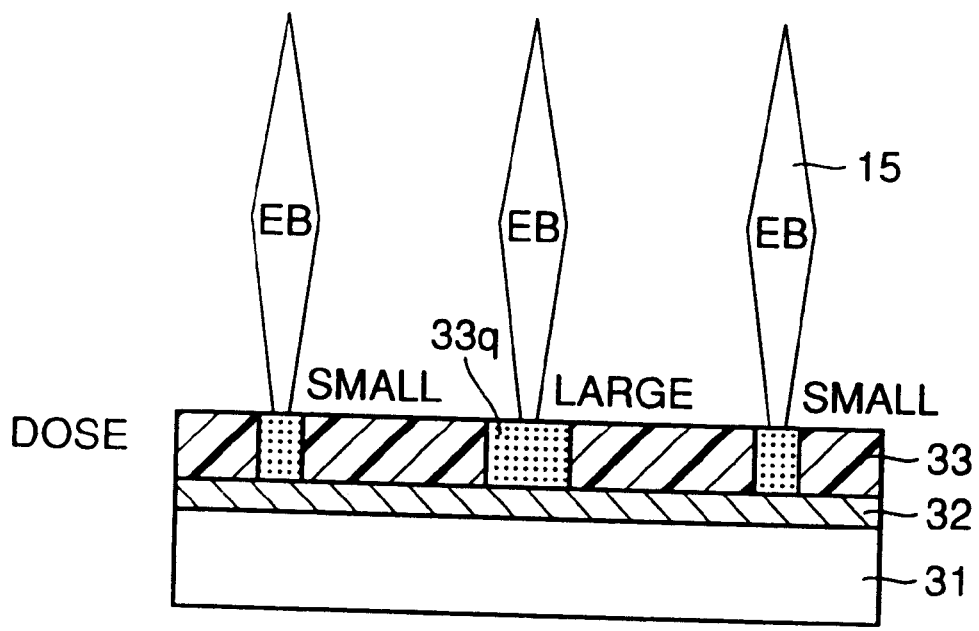
FIG. 12 is a view describing a step in which a dose has a distribution in EB writing in the second embodiment of the present invention.
Figure 13:
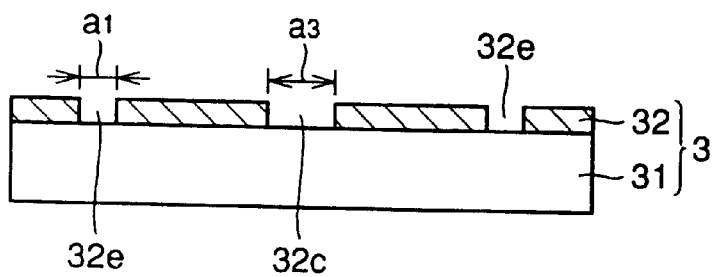
FIG. 13 is a sectional view of a state of the photomask completed through a developing step and an etching step, following the state of FIG. 12.

FIG. 12 is a view representing a manufacturing process for a photomask to be corrected with respect to optical distortion having a characteristic that a transfer size is smaller in the central region but larger in the peripheral region as shown in Table 1. In FIG. 12, a dose of EB is more in the central region of a photomask but less in the peripheral region. As a result, a writing section 33q is larger in the central region, but smaller in the peripheral region. When the manufacturing process for a photomask as shown in FIGS. 7 to 12 is applied to a resist 33 having such a writing section distribution, then a photomask 3 having a pattern shown in FIG. 13 can be obtained. In the photomask of FIG. 13, a diameter $a_3$ of a Cr-lacking section 32c in the central region is larger than a diameter $a_1$ of a Cr-lacking section 32e in the peripheral region.

Figure 14:
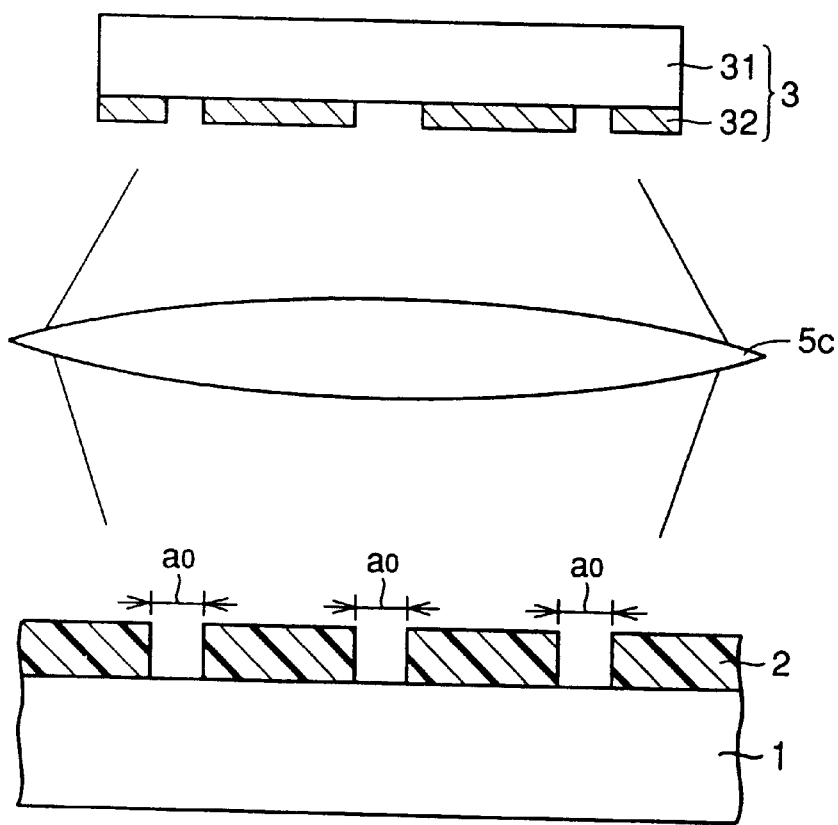
FIG. 14 is a view describing a step in which an exposure process is performed using the photomask shown in FIG. 13.

When thus corrected photomask is used in an exposure apparatus having the measurement result of Table 1 to form a transferred pattern, then, for example, gate patterns with a uniform size ao as intended or the like can be obtained in a photoresist 42 on a semiconductor substrate 41 as shown in FIG. 14.

[Third Embodiment]

Figure 15:
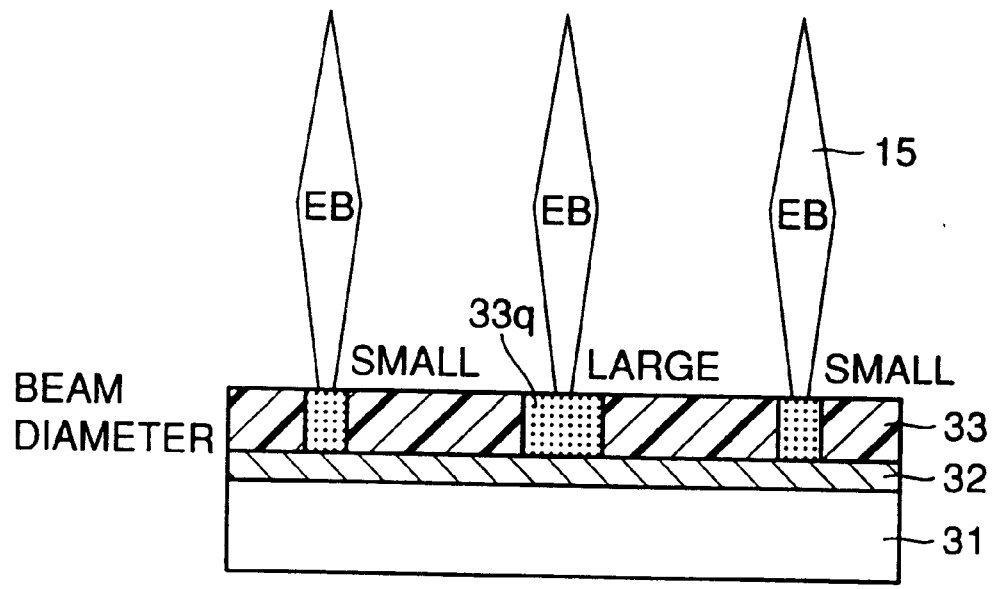
FIG. 15 is a view describing a step in which a beam diameter has a distribution in EB writing in a third embodiment of the present invention.

The third embodiment of the present invention is a process for performing correction of a pattern on a photomask in a writing step similar to the second embodiment. A process shown in FIG. 15 is a process in which in EB writing, a beam diameter of EB with which a resist is irradiated is adjusted, for example, such that a beam diameter is larger in the central region and smaller in the peripheral region. A large sized writing section 33q is formed in an irradiated portion where a beam diameter is larger and contrary to this, a smaller writing section 33q is formed in an irradiated portion where a beam diameter is smaller. Thereafter, by applying the manufacturing process for a photomask shown in FIGS. 7 to 11, a photomask 3 shown in FIG. 16 can be obtained.

Figure 16:
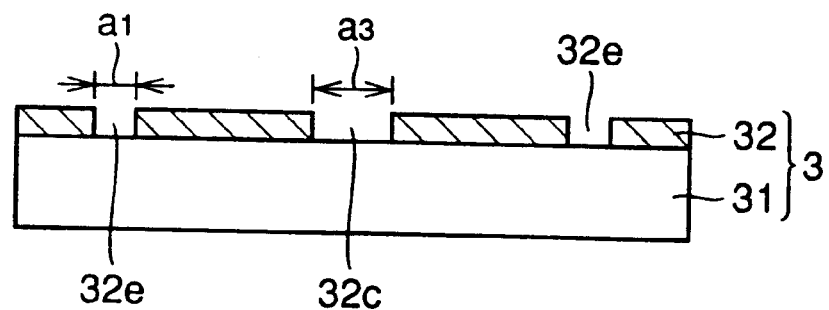
FIG. 16 is a sectional view of a state of the photomask completed through a developing step and an etching step, following the stage of FIG. 15.

In FIG. 16, a diameter $a_3$ of a Cr-lacking section 32c in the central region where an EB beam diameter is larger is larger than a diameter $a_1$ of a Cr-lacking 32e in the peripheral region. As a result, when the photomask shown in FIG. 16 is used in an exposure apparatus having optical distortion as shown in Table 1, then a transferred pattern having a uniform distribution as intended can be obtained as shown in FIG. 14.

[Fourth Embodiment]

Figure 17A:
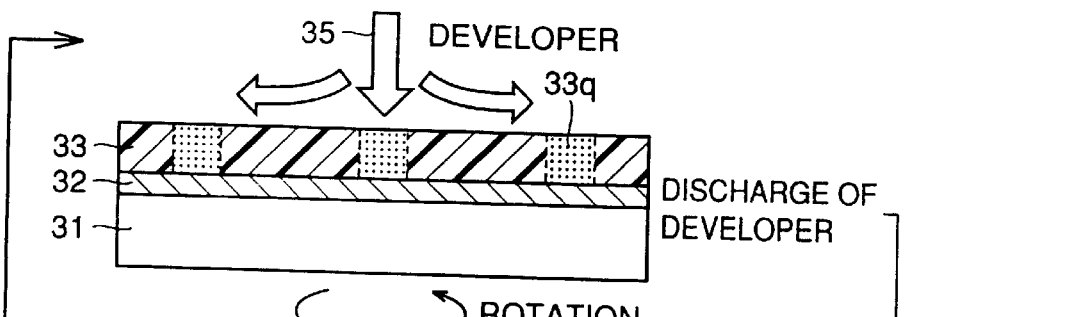
FIG. 17A is a view of a step of supplying a developer.
Figure 17B:
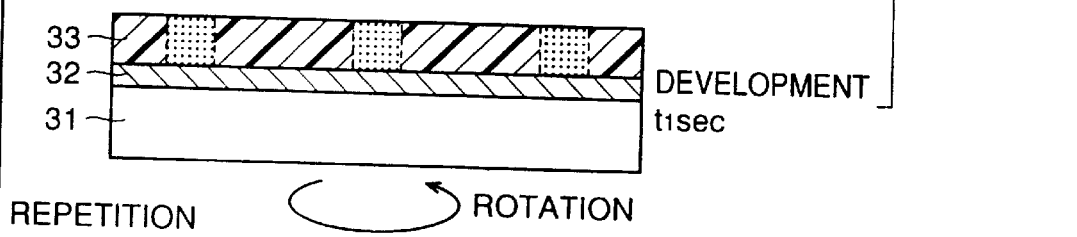
FIG. 17B is a view of a step in stoppage of supply of the developer to allow a developing reaction to proceed.
Figure 17C:
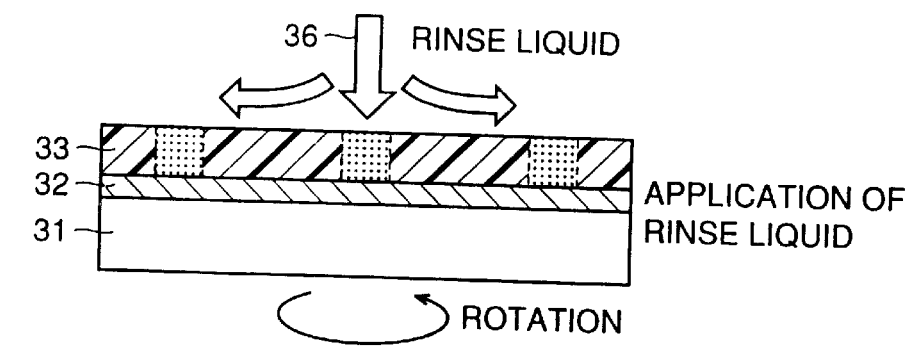
FIG. 17C is a step of supplying a rinse liquid and FIG. 17D is a step in stoppage of supply of the rinse liquid, all being included in the fourth embodiment of the present invention.
Figure 17D:
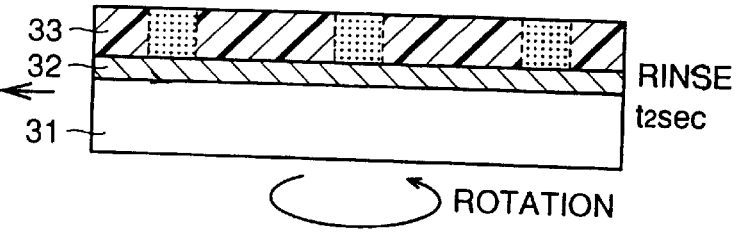

In the fourth embodiment of the present invention, description will be given of a manufacturing process for a photomask which is corrected in a developing step with respect to optical distortion of an exposure apparatus. Detailed description will be first given of a developing step. FIG. 17A is a figure showing a substep in which a developer 35 is supplied while rotating a photoresist having a writing section 33q about its center and FIG. 17B is a figure showing a substep in which supply of the developer is temporarily ceased to progress a developing chemical reaction for t1 second. The substeps of FIGS. 17A and 17B are major substeps. Moreover, FIG. 17C is a figure showing a substep in which a rinse liquid 36 to remove the developer is applied and FIG. 17D is a figure showing a substep in which supply of the rinse liquid is ceased for t2 second. In the developing step, a series of the substeps shown in FIGS. 17A to 17D are repeated several times.

Figure 18:
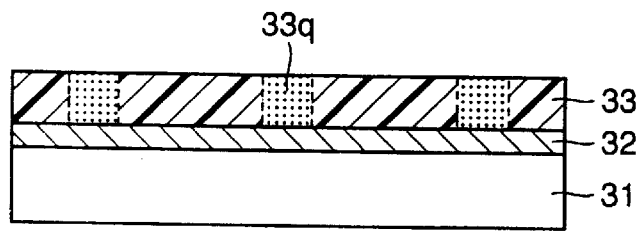
FIG. 18 is a sectional view describing a state of a photomask after EB writing is over in the fourth embodiment of the present invention.
Figure 19:
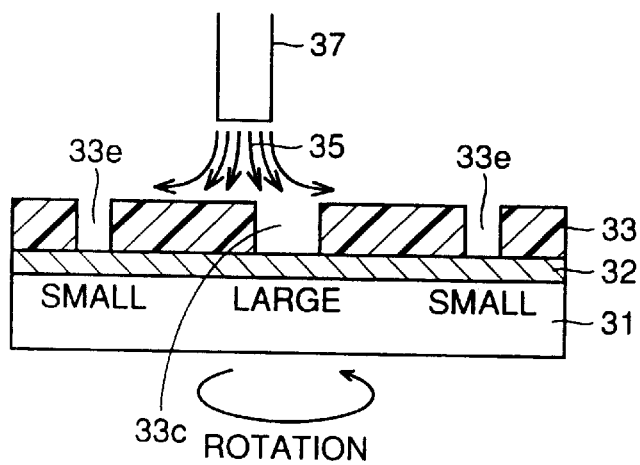
FIG. 19 is a view describing a state in which a developer is supplied from a movable nozzle located in the central region of a photomask.

FIG. 18 is a photomask having a resist including writing sections 33q in a stage after EB writing is over. For convenience of description, it is assumed that areas of the respective writing sections 33q are uniform regardless of respective locations on a resist. When in development of the photomask in the state of FIG. 18, a developer nozzle 37 is positioned in the central region or is directed toward the central region, then an unused, fresh developer is first supplied in the central region. Although the photomask is developed while rotating, a fresh developer is supplied more in the central region than in the peripheral region; therefore, a developing reaction progresses faster in the central region than in the peripheral region. As a result, as shown in FIG. 19, a diameter of a resist-lacking section 33c in the central region is larger than a diameter of a resist-lacking section 33e in the peripheral region.

Figure 20:
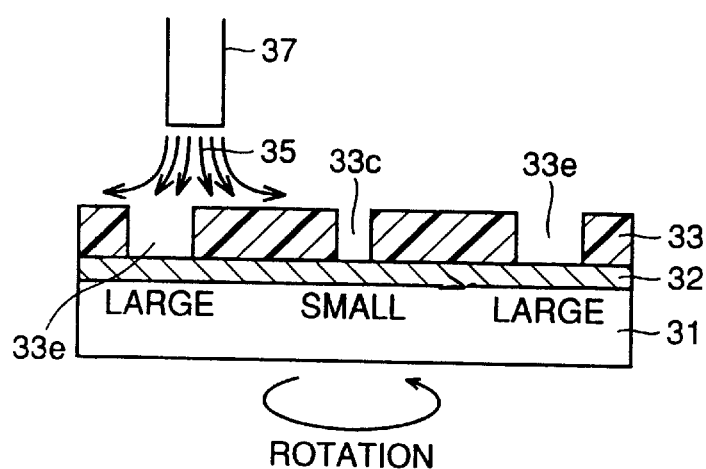
FIG. 20 is a view describing a state in which a developer is supplied from a movable nozzle located in the peripheral region of the photomask.

To the contrary, as shown in FIG. 20, when the developer nozzle 37 is positioned in the peripheral region or directed toward the peripheral region, an unused, fresh developer is first supplied in the peripheral region. Since the photomask is rotated during the developing step, the fresh developer is supplied not only in part of the peripheral region, but all over the peripheral region of the photomask. As a result, as shown in FIG. 20, a diameter of the resist-lacking section 33e in the peripheral region of the photomask is larger than that of the resist-lacking section 33C in the central region. While FIGS. 19 and 20 described above are for the case where a movable nozzle is employed, a nozzle position is unnecessary to be fixed through all the step of development. The positions thereof shown in FIGS. 19 and 20 are alternately selected with a prescribed period at one position to obtain a desired pattern.

Moreover, it is easy to attain an idea from the above description that when a plurality of nozzles are used in the development, a supply amount of a developer is adjusted according to regions: the central region and the peripheral region and thereby, a size distribution of a resist-lacking section is provided across the photomask.

When the photomask having a diameter distribution of a resist-lacking section is subjected to the following manufacturing steps, the photomask can be obtained in a completed form having a desired size distribution of a Cr-lacking section.

[Fifth Embodiment]

In the fifth embodiment of the present invention, description will be given of a manufacturing process for a photomask having a desired size distribution in a wet etching step. That is, in the wet etching, a size distribution can be achieved on a photomask by altering a discharge direction of and a discharge method for the etching liquid.

Figure 21:
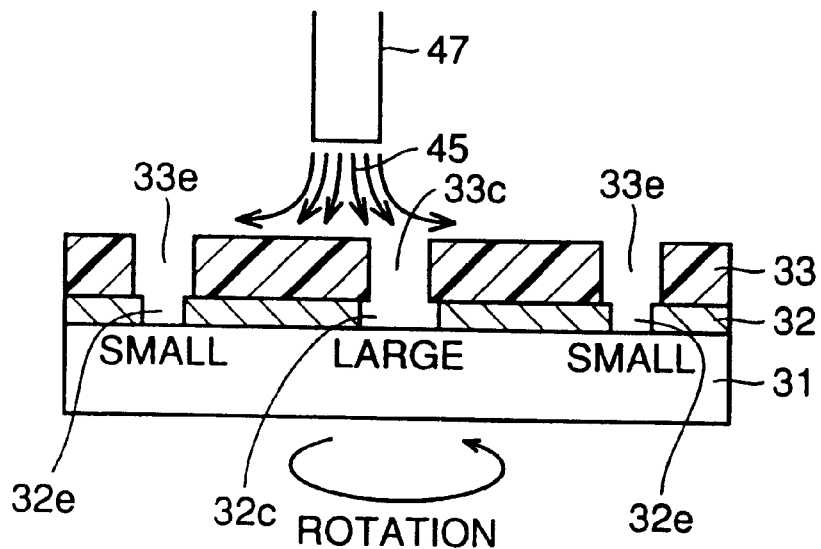
FIG. 21 is a view describing a state in which a etching liquid is supplied from a movable nozzle located in the central region of a photomask in a fifth embodiment of the present invention.

A case is considered of, for example, etching of a photomask on which uniformly sized resist-lacking sections are distributed for convenience of description. As shown in FIG. 21, even when uniformly sized resist-lacking sections are distributed, a size of a Cr film-lacking section $32c$ in the ceitral region is larger than that of a Cr film-lacking section $32e$ in the peripheral region when an etching liquid nozzle 47 is positioned in the central region or directed toward the central region.

Figure 22:
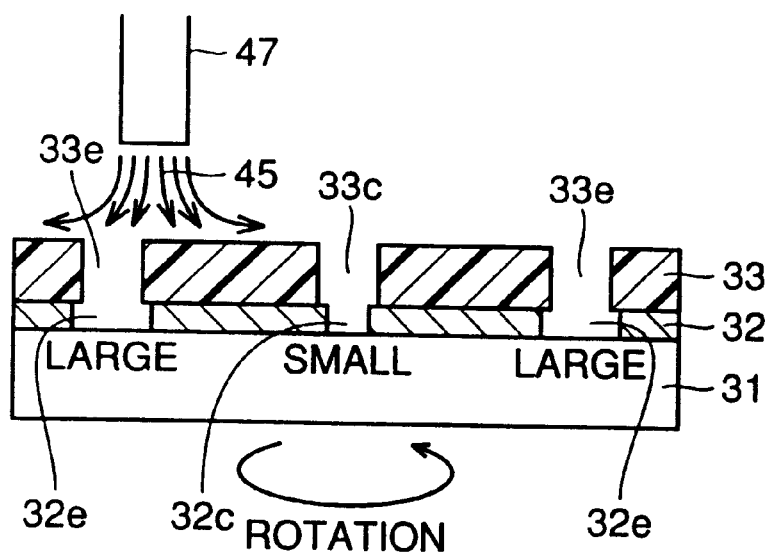
FIG. 22 is a view describing a state in which a etching liquid is supplied from a movable nozzle located in the peripheral region of the photomask in the fifth embodiment.

To the contrary, as shown in FIG. 22, when the etching liquid nozzle 47 is positioned in the peripheral region or directed toward the peripheral region, an unused, fresh developer is first supplied in the peripheral region. Since the photomask is rotated during the developing site, the fresh developer is supplied not only in part of the peripheral region, but also all over the peripheral region of the photomask. As a result, as shown in FIG. 22, a diameter of a Cr film-lacking section $32e$ in the peripheral region of the photomask is larger than that of a Cr film-lacking section $32c$ in the central region.

Similar to the developing step, there is no need to fixedly keep a nozzle position through all the step of the etching. The positions thereof shown in FIGS. 21 and 22 are alternately selected with a prescribed period at one position to obtain a desired pattern.

Moreover, it is easy to attain an idea from the above description that when a plurality of nozzles are used in the etching, a supply amount of an etching liquid is adjusted according to regions: the central region and the peripheral region and thereby, a desired size distribution of a Cr film-lacking section is provided across the photomask.

When the photomask having a size distribution of a Cr film-lacking section is employed, a transferred pattern having a desired size distribution including that of uniform sizes can be obtained on a semiconductor wafer.

[Sixth Embodiment]

In the sixth embodiment of the present invention, a photomask having a desired size distribution can be obtained by control of a plasma by a magnetic field in dry etching.

Figure 23:
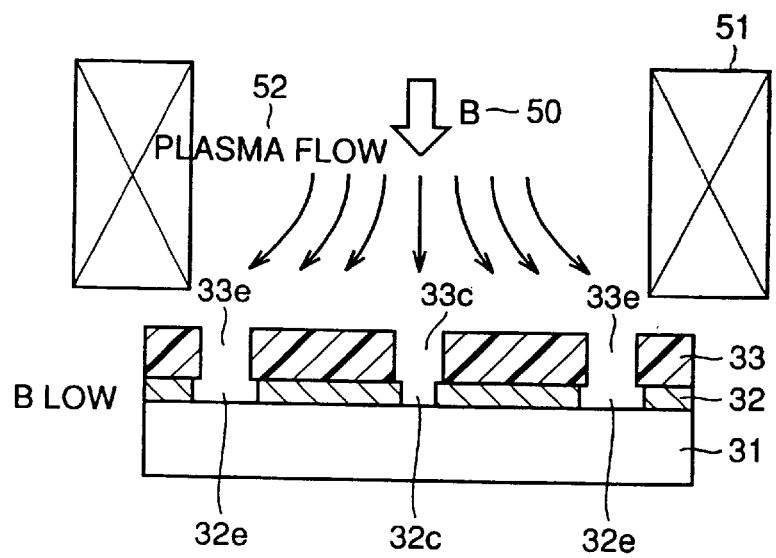
FIG. 23 is a view describing a state of etching in a case where a magnetic field strength is low in magnetic-enhanced dry etching of a sixth embodiment of the present invention.
Figure 24:
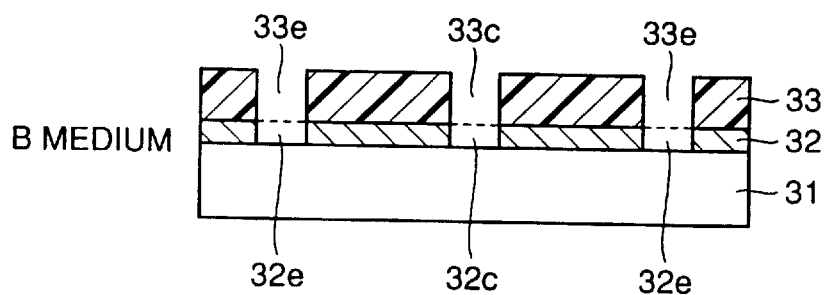
FIG. 24 is a view describing a state of etching in a case where a magnetic field strength is higher than that of FIG. 23 in magnetic-enhanced dry etching of the sixth embodiment.
Figure 25:
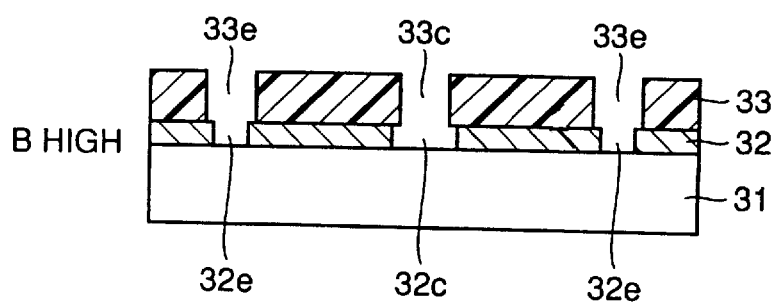
FIG. 25 is a view describing a state of etching in a case where a magnetic field strength is higher than that of FIG. 24 in magnetic-enhanced dry etching of the sixth embodiment.

It is assumed that resist-lacking sections have a distribution of uniform sizes for the sake of convenience of description. When a magnetic-enhanced dry etching is applied and a magnetic flux density B is low as shown in FIG. 23, that is when a magnetic field strength is weak, then a plasma flow constituted of a etching gas is supplied more in the peripheral region and a Cr film-lacking section $32e$ in the peripheral region is larger compared with a Cr film-lacking section $32c$ in the central region. As a magnetic field strength increases, sizes of Cr film-lacking sections in the central region and peripheral region are almost equal to each other as shown in FIG. 24. As a magnetic field strength increases further, a size distribution can be obtained in which a Cr-lacking section in the peripheral region is larger compared with that in the central region.

As described above, even when resist-lacking sections have a size distribution of uniform sizes, a photomask on which a desired size distribution of a Cr-lacking section is formed can be obtained by adjusting a strength of an applied magnetic field in plasma gas dry etching.

[Seventh Embodiment]

Figure 26:
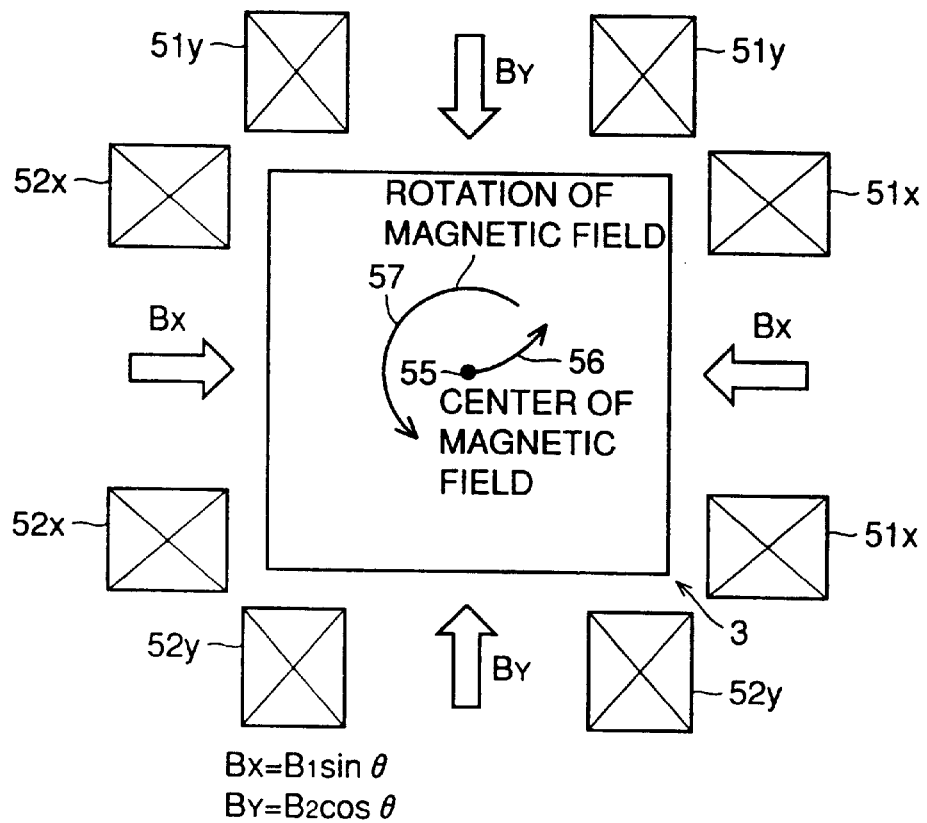
FIG. 26 is a plan view describing dry etching applied with a plurality of magnetic fields of a seventh embodiment of the present invention.
Figure 27:
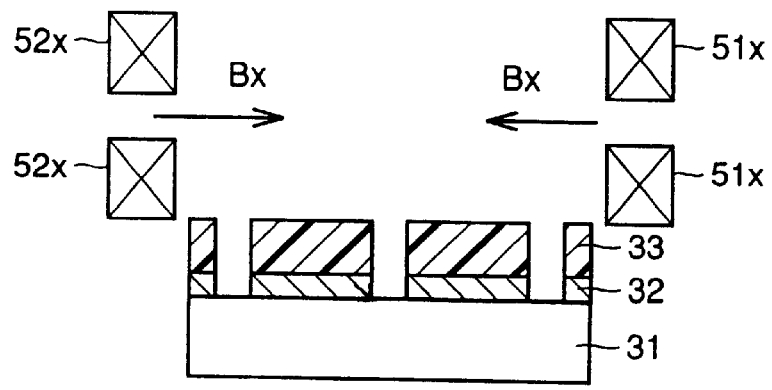
FIG. 27 is a front view representing a configuration in the dry etching of FIG. 26.

In the seventh embodiment of the present invention, a plurality of magnetic fields are applied in parallel to a photomask surface to control a plasma gas flow in dry etching. In FIGS. 26 and 27, coils $51x$ and $52x$ are arranged such that magnetic fields which have equal strengths to each other in X directions with opposed senses are applied on the photomask, acting from both sides thereof and furthermore, coils $51y$ and $52y$ are arranged such that magnetic fields work on the photomask in Y direction similar to the case of X direction. There is established a relation of $Bx=Bis_1 \sin \theta$ and $By=B_2 \cos \theta$, and Bx and By generate a rotating magnetic field with a direction of rotation 57 on the photomask in synchronism between Bx and By, between the X direction magnetic field and the Y direction magnetic field. While a center 55 of the composite magnetic field is located at the center of the photomask when $B_1$ and $B_2$ are equal in magnitude, by altering magnitudes of $B_1$ and $B_2$ relatively, the center can be shifted, for example, along a direction 56. As a result, when optical distortion does not exist at the same level along a concentric circle and an optical distortion alters with a gradient in a prescribed direction, a size distribution of a Cr film-lacking section which can correct such optical distortion can be provided with simplicity and convenience. As a result, by altering magnetic field strengths on a pattern independently using respective magnetic field generators, a photomask can be obtained which corrects any type of optical distortion.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing process for a semiconductor device including a step of transferring a pattern on a photomask onto a semiconductor wafer by means of an exposure apparatus, regarding optical distortion of said exposure apparatus as a variation in reduction rate of a transferred pattern in each of regions of a photomask, including:

a first step of transferring a fundamental pattern formed on a reference photomask for measuring the optical distortion to measure a size of said transferred pattern in a corresponding one of regions; and a second step of, based on a result obtained in said first step, forming a corrected photomask having a pattern corrected in said corresponding one of regions with respect to said optical distortion.

2. The manufacturing process for a semiconductor device according to claim 1, wherein a fundamental pattern on said reference photomask is a plurality of unit patterns of the same shape arranged on the reference photomask.

3. The manufacturing process for a semiconductor device according to claim 1, wherein a fundamental pattern on said reference mask is a non-periodical pattern with no periodicity formed on the reference photomask.

4. The manufacturing process for a semiconductor device according to claim 1, wherein said first step includes: a step of obtaining a reduction rate which is a rate between a size of said transferred fundamental pattern and a size of said fundamental pattern on said reference photomask in each of regions of said reference photomask.

5. The manufacturing process for a semiconductor device according to claim 4, herein, in said second step, a size of a pattern in each of said regions of said corrected photomask is formed such that a corrected reduction rate which is a rate between a size of a corrected, transferred pattern that is a transferred pattern of a pattern of said corrected photomask and a size of a pattern on said photomask prior to the correction in each of the regions is the same throughout all said regions regardless of each locality.

6. The manufacturing process for a semiconductor device according to claim 5, wherein, in said second step, a size of a pattern in each of said regions of said corrected photomask is formed such that a product of a pattern correction rate which is a rate between a size of a pattern in a region on said corrected photomask and a size of a pattern in a corresponding region of said photomask prior to the correction, and a reduction rate in said region is the same regardless of which of all said regions said region belongs to.

7. The manufacturing process for a semiconductor device according to claim 4, wherein, in said second step, a pattern of a prescribed portion of said semiconductor device is arranged in each of said regions of said corrected photomask in a similar way, and a size of a pattern in each of said regions of said prescribed portion of said semiconductor device is determined such that a product of a size of a pattern of said prescribed portion of said semiconductor device in a region on the corrected photomask and a reduction rate in said region is the same all over said regions regardless of which of all said regions said region belongs to.

8. The manufacturing process for a semiconductor device according to claim 1, wherein said second step includes: a photomask manufacturing process and a pattern of said corrected photomask is corrected in terms of size by adjusting at least one of a writing beam diameter and a writing dose with respect to a position of said corrected photomask in a resist writing step of the photomask manufacturing process.

9. The manufacturing process for a semiconductor device according to claim 1, wherein said second step includes: a photomask manufacturing process and a pattern on said corrected photomask is corrected ir terms of a size by adjusting a way of supply of a developer in a resist developing step of the photomask manufacturing process.

10. The manufacturing process for a semiconductor device according to claim 1, wherein said second step includes a photomask manufacturing process and a pattern on said corrected photomask is corrected in terms of size by adjusting a way of supply of an etching liquid in a wet etching step for a Cr film in the photomask manufacturing process.

11. The manufacturing process for a semiconductor device according to claim 1, wherein said second step includes: a photomask manufacturing process and a pattern of said corrected photomask is corrected in terms of size by adjusting a strength of a magnetic field in a dry etching step for a Cr film of the photomask manufacturing process.

12. The manufacturing process for a semiconductor device according to claim 11, wherein said magnetic field in a dry etching step for said Cr film is a rotating magnetic field formed such that a combination of two orthogonal magnetic fields are applied in synchronism with each other in parallel to a surface of said corrected photomask and adjustment of a strength of said magnetic field is effected by controlling said two magnetic fields independently of each other.

13. The manufacturing process for a semiconductor device according to claim 1, wherein said second step includes: a photomask manufacturing process and a pattern on said corrected photomask is corrected in terms of size by combining factors for a change in size of a pattern in at least two steps among a resist writing step, a resist developing step and a Cr film etching step of the photomask manufacturing process.

* * * * *